US012571818B2

(12) United States Patent
Rendon Hernandez et al.

(10) Patent No.: US 12,571,818 B2
(45) Date of Patent: Mar. 10, 2026

(54) PCB TRACE CURRENT SENSOR FOR ENERGY MEASUREMENT

(71) Applicant: Schneider Electric USA, Inc., Andover, MA (US)

(72) Inventors: Adrian Abdala Rendon Hernandez, Tiffin, IA (US); Juan Ignacio Melecio Ramirez, North Liberty, IA (US); Collin Richard Fischels, Independence, IA (US); Austin Derby, Cedar Rapids, IA (US)

(73) Assignee: Schneider Electric USA, Inc., Boston, MA (US)

( * ) Notice: Subject to any disclaimer, the term of this patent is extended or adjusted under 35 U.S.C. 154(b) by 105 days.

(21) Appl. No.: 18/367,256

(22) Filed: Sep. 12, 2023

(65) Prior Publication Data

US 2024/0329089 A1      Oct. 3, 2024

Related U.S. Application Data

(60) Provisional application No. 63/456,427, filed on Mar. 31, 2023.

(51) Int. Cl.
G01R 15/18 (2006.01)
G01R 19/00 (2006.01)
(Continued)

(52) U.S. Cl.
CPC ....... G01R 15/181 (2013.01); G01R 19/0092 (2013.01); H05K 1/115 (2013.01); H05K 1/165 (2013.01)

(58) Field of Classification Search
CPC .. G01R 15/181; G01R 19/2513; G01R 31/52; H05K 1/0216; H05K 1/116
See application file for complete search history.

(56) References Cited

U.S. PATENT DOCUMENTS

| | | | |
|---|---|---|---|
| 6,313,623 B1 | 11/2001 | Kojovic | |
| 6,400,130 B2 | 6/2002 | Berkcan | |

(Continued)

FOREIGN PATENT DOCUMENTS

| | | | |
|---|---|---|---|
| EP | 2887076 A1 | 6/2015 | |
| WO | 2015124975 A1 | 8/2015 | |

OTHER PUBLICATIONS

Extended Search Report for EP App. No. 24163463.3 dated Jul. 25, 2024, 22 pages.

(Continued)

*Primary Examiner* — Dominic E Hawkins
(74) *Attorney, Agent, or Firm* — Patterson + Sheridan, LLP

(57) ABSTRACT

Systems and methods for sensing current provide a Rogowski coil type current sensor for a current flow monitoring device in which the coil windings are formed by electrically conductive traces on a printed circuit board (PCB) substrate. Each coil winding is composed of two or more elongate traces formed on a PCB substrate and extending radially outward from a central opening or hole in the PCB substrate. Each trace coil winding is connected to electrically conductive vias, one via at each end of the trace. The via at one end connects the trace to another trace in coil winding, while the via at the other end connects the trace to a different trace in the same coil winding or an adjacent coil winding. The result is a conductive helix encircling the central opening in the PCB substrate that electrically resembles a Rogowski coil.

19 Claims, 12 Drawing Sheets

(51) Int. Cl.
  *H05K 1/11*          (2006.01)
  *H05K 1/16*          (2006.01)

(56)                  References Cited

U.S. PATENT DOCUMENTS

| | | | |
|---|---|---|---|
| 6,617,858 B1 | 9/2003 | Baumgaertl | |
| 7,078,888 B2 | 7/2006 | Budillon | |
| 7,365,535 B2* | 4/2008 | Muniraju | G01R 15/207 |
| | | | 324/225 |
| 7,902,812 B2 | 3/2011 | Kojovic | |
| 8,324,883 B2 | 12/2012 | Turpin | |
| 9,291,647 B2 | 3/2016 | Wynne | |
| 10,333,289 B2 | 6/2019 | Loglisci | |
| 10,365,305 B2 | 7/2019 | Olivier | |
| 10,416,196 B2 | 9/2019 | Urankar | |
| 10,823,763 B2 | 11/2020 | Houbre | |
| 10,901,006 B2 | 1/2021 | Mattmiller | |
| 11,105,833 B2 | 8/2021 | Rondot | |
| 11,322,297 B2 | 5/2022 | Urankar | |
| 11,391,760 B2 | 7/2022 | Rondot | |
| 11,501,931 B2 | 11/2022 | Brower | |
| 2006/0082356 A1 | 4/2006 | Zhang | |
| 2008/0036448 A1 | 2/2008 | Kovach et al. | |
| 2013/0314083 A1 | 11/2013 | Loglisci | |
| 2014/0167740 A1 | 6/2014 | Gilbert | |
| 2014/0167786 A1 | 6/2014 | Gutierrez | |
| 2014/0167787 A1 | 6/2014 | Sanchez | |
| 2015/0371798 A1 | 12/2015 | Zheng | |
| 2017/0356934 A1* | 12/2017 | Hurwitz | G01R 15/181 |
| 2017/0356935 A1* | 12/2017 | Hurwitz | G01R 19/12 |
| 2022/0291258 A1 | 9/2022 | Kostadinova | |
| 2024/0120725 A1* | 4/2024 | Hurwitz | G01R 31/1272 |

OTHER PUBLICATIONS

Jiao, Chaoqun, et al., "Research on Small PCB Rogowski Coil Measuring Transient Current in the Power Electronics Devices", Sensors—MDPI, 2019. https://www.mdpi.com/1424-8220/19/19/4176.

Gu, Peng-Yu, et al., "PCB Rogowski Coils for 300 kA current measurement on a multi-split conductor", IEEE Sensors Journal, 2019. https://ieeexplore.ieee.org/document/8706945.

Parkhideh, Babak, et al., "Hybrid Magnetoresistor-Planar Rogowski Current Sensing Scheme With Folded Trace Magnetic Field Concentration Technique", IEEE Sensors Journal, 2017. https://ieeexplore.ieee.org/document/7892845.

Nurmansah, Ary P., et al., "Design and testing PCB Rogowski-coil current sensor for high current application", 2017 International conference on High Voltage Engineering and Power Systems, 2017. https://ieeexplore.ieee.org/ document/8225897.

Tsukuda, M., et al., "Micro PCB Rogowski coil for current monitoring and protection of high voltage power modules", Microelectronics Reliability, 2016. https://www.sciencedirect.com/science/article/abs/pii/S002627141630155X.

Tao, Tato, et al., "Design of PCB Rogowski Coil and Analysis of Anti-interference Property", IEEE Transactions on Electromagnetic Compatibility, 2016. https://ieeexplore.ieee.org/document/7397992.

* cited by examiner

300

125     102
(Line 1)

125′     102′
(Line 2)

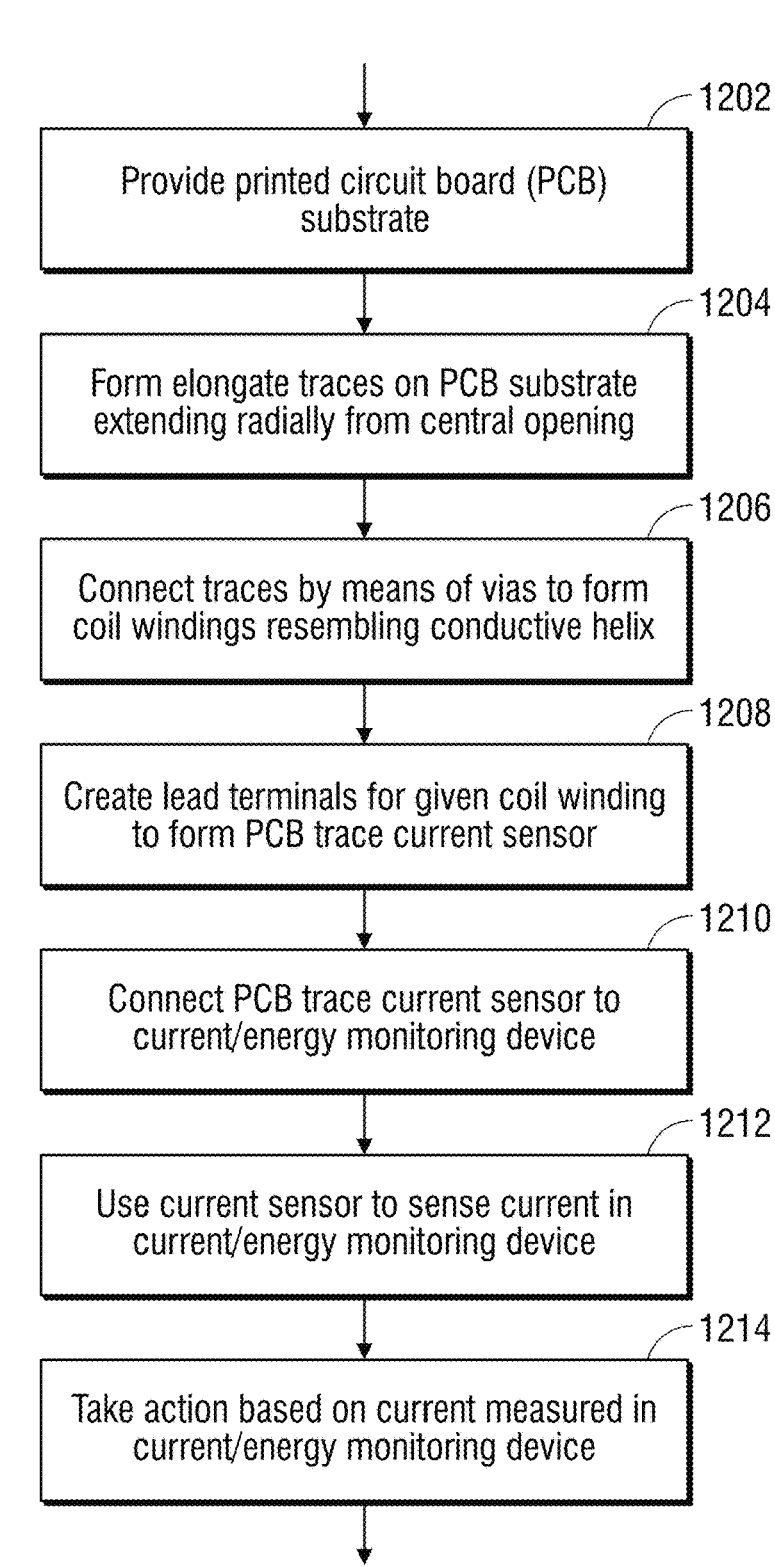

1200

1202

Provide printed circuit board (PCB) substrate

1204

Form elongate traces on PCB substrate extending radially from central opening

1206

Connect traces by means of vias to form coil windings resembling conductive helix

1208

Create lead terminals for given coil winding to form PCB trace current sensor

1210

Connect PCB trace current sensor to current/energy monitoring device

1212

Use current sensor to sense current in current/energy monitoring device

1214

Take action based on current measured in current/energy monitoring device

FIG. 12

PCB TRACE CURRENT SENSOR FOR ENERGY MEASUREMENT

CROSS-REFERENCE TO RELATED APPLICATIONS

This application claims the benefit of priority to and incorporates herein by reference U.S. Provisional Application No. 63/456,427, entitled "PCB TRACE CURRENT SENSOR FOR ENERGY MEASUREMENT," filed Mar. 31, 2023.

TECHNICAL FIELD

The present disclosure relates to circuit breakers, metering devices, wiring devices, and other devices that monitor and measure current flow, and more particularly to systems and methods for sensing current in such devices using a PCB trace current sensor having a reduced size to allow for easier installation.

BACKGROUND

Modern protection devices (e.g., circuit breakers), metering devices, wiring devices, and other devices that monitor and measure current flow and energy usage have components that enable several functions not previously available in prior devices. For example, a CPU (e.g., microcontroller) in an electronic circuit breaker allows the breaker to function as both a ground fault circuit interrupt (GFCI) device as well as an arc fault circuit interrupt (AFCI) device. The CPU detects such faults by constantly sensing and sampling line current and monitoring these currents.

In many electronic circuit breakers, the current sensor is a current transformer that has a large number of wire loops, or windings, wrapped around a toroidal core, usually made of ferromagnetic material alloys. The current transformer may be optimized by adjusting the number of windings (turns), by using a ferrite core, and the like. Some circuit breakers use a so-called "coreless" current sensor, also known as a "current rate of change" or "di/dt" sensor, a "current rise time" sensor, or a Rogowski coil, where the toroidal core is non-ferromagnetic. The Rogowski coil type current sensor provides an output signal, which is a voltage, that is proportional to the rate of change of the input signal, which is the line current.

However, the use of conventional current transformers as current sensors presents several design challenges. For one thing, these current transformers tend to be bulky and occupy a lot of space, making them difficult to incorporate into an already crowded electronic circuit breaker. This is especially true for miniature circuit breakers (MCB) where internal spacing is even more constrained. Additional challenges also arise due to the increased mechanical complexity that typically accompanies installation of such conventional current transformers within a circuit breaker, wiring device, or metering device.

Accordingly, a need exists for a way to reduce the internal spacing required by current sensors within devices that monitor and measure current flow.

SUMMARY

Embodiments of the present disclosure relate to systems and methods for reducing the internal spacing required by current sensors within protection devices, wiring devices, metering devices, and other devices that monitor and measure current flow and energy usage. In some embodiments, the systems and methods provide a Rogowski coil type current sensor in which the coil windings are formed by electrically conductive traces on a printed circuit board (PCB) substrate. More specifically, each coil winding is composed of two or more elongate traces formed on a PCB substrate and extending radially outward from a central opening or hole in the PCB substrate. Each trace in the coil winding is connected to electrically conductive vias (vertical interconnect access), one via at each end of the trace. The via at one end connects the trace to another trace in the coil winding, while the via at the other end connects the trace to a different trace in the same coil winding or an adjacent coil winding. The result is a conductive helix encircling the central opening in the PCB substrate that electrically resembles a Rogowski coil. Lead terminals for the PCB trace current sensor may then be formed by omitting the via at one end of any given pair of traces and connecting circuit leads to the open-ended traces.

In some embodiments, alternating coil windings on the PCB substrate may have a different overall length in order to avoid overcrowding of the traces near the central opening as a result of the radially outward direction of the traces.

In some embodiments, a signal conditioning circuit may be provided on the PCB substrate for convenient conditioning and processing of the voltage signals output by the PCB trace current sensor.

The above PCB trace current sensor provides several advantages over current sensors that are based on conventional current transformers. For example, the PCB trace current sensor has a reduced volume, small footprint, low profile, simple hardware architecture, installs more easily into current flow monitoring devices (e.g., circuit breakers, metering devices, or wiring devices), and is relatively inexpensive to manufacture compared to current sensors that are based on conventional current transformers.

The above PCB trace current sensor also provides galvanic isolated monitoring of electrical current, accurate manufacturing reproducibility, and low production cost. The PCB trace current sensor also has the advantage of not containing any ferromagnetic material. This means the PCB trace current sensor does not experience magnetic saturation, resulting in a significantly larger bandwidth than conventional current transformers, thereby allowing for measurement of higher currents with the PCB trace current sensor.

In general, in one aspect, embodiments of the present disclosure relate to a current sensor. The current sensor comprises, among other things, a printed circuit board (PCB) substrate having a central opening therein; and a plurality of electrically conductive elongate traces on the PCB substrate extending radially outward from the central opening. The current sensor further comprises a plurality of vertical interconnect access (vias) on the PCB substrate, the vias connecting the traces together so as to form a conductive helix encircling the central opening in the PCB substrate that electrically resembles a Rogowski coil, and lead terminals on the PCB substrate, the lead terminals electrically connected to the plurality of electrically conductive elongate traces.

In general, in another aspect, embodiments of the present disclosure relate to a current flow monitoring device. The current flow monitoring device comprises, among other things, a current conductor in the current flow monitoring device, and a neutral conductor in the current flow monitoring device. The current flow monitoring device further comprises a PCB trace current sensor mounted in the current flow monitoring device and configured to receive the current conductor therethrough, and a monitoring circuit operable to monitor the PCB trace current sensor and determine an amount of current flowing through the current conductor.

In general, in still another aspect, embodiments of the present disclosure relate to a method of providing a current sensor for use in a current flow monitoring device. The method comprises, among other things, forming a plurality of electrically conductive elongate traces on a PCB substrate, the traces extending radially outward from a central opening of the PCB substrate. The method also comprises providing a plurality of vertical interconnect access (vias) on the PCB substrate, the vias connecting the traces together so as to form a conductive helix encircling the central opening in the PCB substrate that electrically resembles a Rogowski coil. The method further comprises creating lead terminals on the PCB substrate, the lead terminals electrically connected to the plurality of electrically conductive elongate traces.

BRIEF DESCRIPTION OF THE DRAWINGS

FIG. 12 shows a flowchart illustrating an exemplary method that may be used with a PCB trace current sensor according to embodiments of the present disclosure.

DETAILED DESCRIPTION

This description and the accompanying drawings illustrate exemplary embodiments of the present disclosure and should not be taken as limiting, with the claims defining the scope of the present disclosure, including equivalents. Various mechanical, compositional, structural, electrical, and operational changes may be made without departing from the scope of this description and the claims, including equivalents. In some instances, well-known structures and techniques have not been shown or described in detail so as not to obscure the disclosure. Further, elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Figure 1:
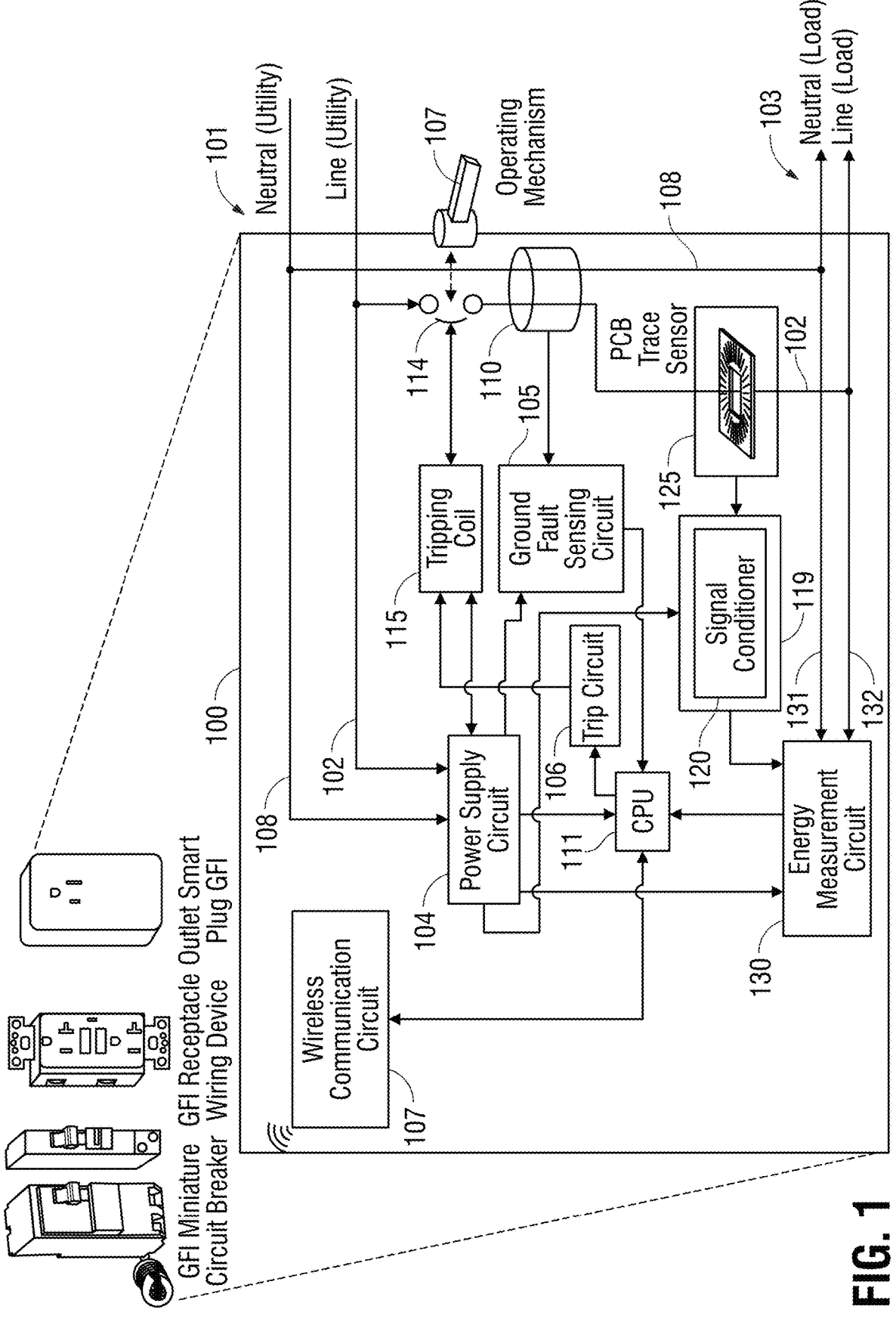
FIG. 1 shows a schematic diagram illustrating an exemplary current flow monitoring device that uses a PCB trace current sensor according to embodiments of the present disclosure.

Referring now to FIG. 1, a schematic diagram is shown for an exemplary current flow monitoring device 100 that uses a PCB trace current sensor according to embodiments of the present disclosure. The current flow monitoring device 100 in this example is a single-pole electronic circuit breaker 100 that is designed to monitor current flow and interrupt the flow upon occurrence of a fault condition. To this end, the breaker 100 includes a number of functional components or modules, some of which are represented here as blocks. It will be understood, of course, that each block shown here (and in subsequent figures) may be divided into several constituent blocks, or two or more blocks may be combined into a single block, within the scope of the present disclosure.

As can be seen, the breaker 100 has a utility power line and a utility neutral line connected to the line side 101 of the breaker 100. Current from the utility power line is carried over a main conductor 102 to various loads connected to the load side 103 of the breaker 100. A neutral conductor 108 connects the load neutrals to the utility neutral line. The breaker 100 in this example includes a ground fault sensing circuit 105 connected to a ground fault sensor 110. The main conductor 102 passes through the ground fault sensor 110 and also through a current sensor 125. An integrator or other signal processing front end 119, which may include a signal conditioner 120, receives the signals from the current sensor 125 and provides the signals to an energy measurement circuit 130. Power for the energy measurement circuit 130, CPU 111, and other components in the breaker 100 is provided by a power supply circuit 104, as shown.

Operation of the breaker 100 is generally well known in the art and therefore only described briefly here. In general, the CPU 111, which may be a microcontroller, monitors current measurements obtained from the ground fault sensor 110 to detect occurrence of a fault condition in a known manner. Upon detection of a fault condition, the CPU 111 outputs a trip signal to a trip circuit 106 that actuates a tripping coil 115, which in turn opens a trip mechanism 114 (e.g., switch, relay) to interrupt current flow through the breaker 100. A reset mechanism 107 allows a user to later set/reset the trip mechanism 114 after a trip event. Energy and power usage is measured by the energy measurement circuit 130 using line voltage 132, neutral voltage 131, and current signal supplied by a signal processing front end 119. A wireless communication circuit 107 may be used to transmit trip data, current measurements, energy measurements, and other information to an external monitoring system, such as a power usage monitoring system, for analysis.

In accordance with embodiments of the present disclosure, the current sensor 125 is a Rogowski coil type current sensor in which the coil windings are formed from electrically conductive traces on a PCB substrate. The traces have a generally elongate form such that the overall lengths are much longer relative to their widths, resembling line segments in some embodiments. Such a PCB trace current sensor provides several advantages over conventional current sensors, including a reduced volume, small footprint, low profile, simple hardware architecture, easier assembly and installation, and is relatively inexpensive to manufacture compared to conventional current transformers. As an example, the PCB trace current sensor herein was found in one implementation to have about a 3× reduction in volume over an equivalent conventional current sensor.

Figure 2:
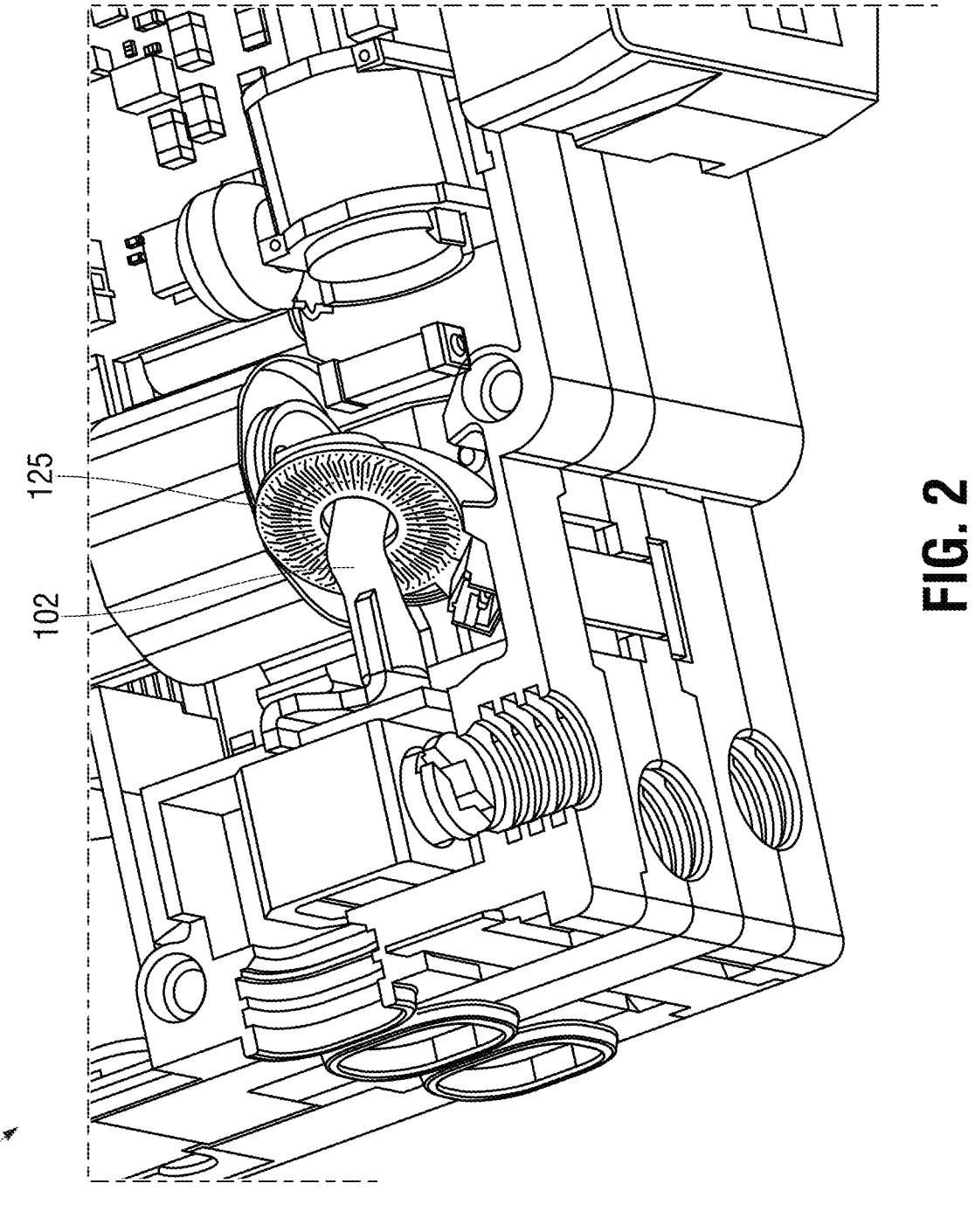
FIG. 2 shows a partial perspective view illustrating an exemplary PCB trace current sensor installed within a current flow monitoring device according to embodiments of the present disclosure.

FIG. 2 is a partial perspective view showing the breaker 100 with the PCB trace current sensor 125 installed therein according to embodiments of the present disclosure. The current sensor 125 may be secured within the breaker 100 using any suitable technique (e.g., brackets, etc.) known to those having ordinary skill in the art for mounting a PCB in a circuit breaker like the breaker 100. As can be seen, the PCB trace current sensor 125 is used to sense current in a similar manner as a conventional current sensor by running the main conductor 102 through a central opening in the current sensor 125. Unlike a conventional current sensor, however, installation of the PCB trace current sensor 125 is simpler and requires less space in the breaker 100 due to its reduced volume, small footprint, and low profile. As alluded to above, these attributes make the PCB trace current sensor 125 especially suitable for use in circuit breakers where internal spacing is highly constrained, such as miniature circuit breakers (MCB).

Figure 3:
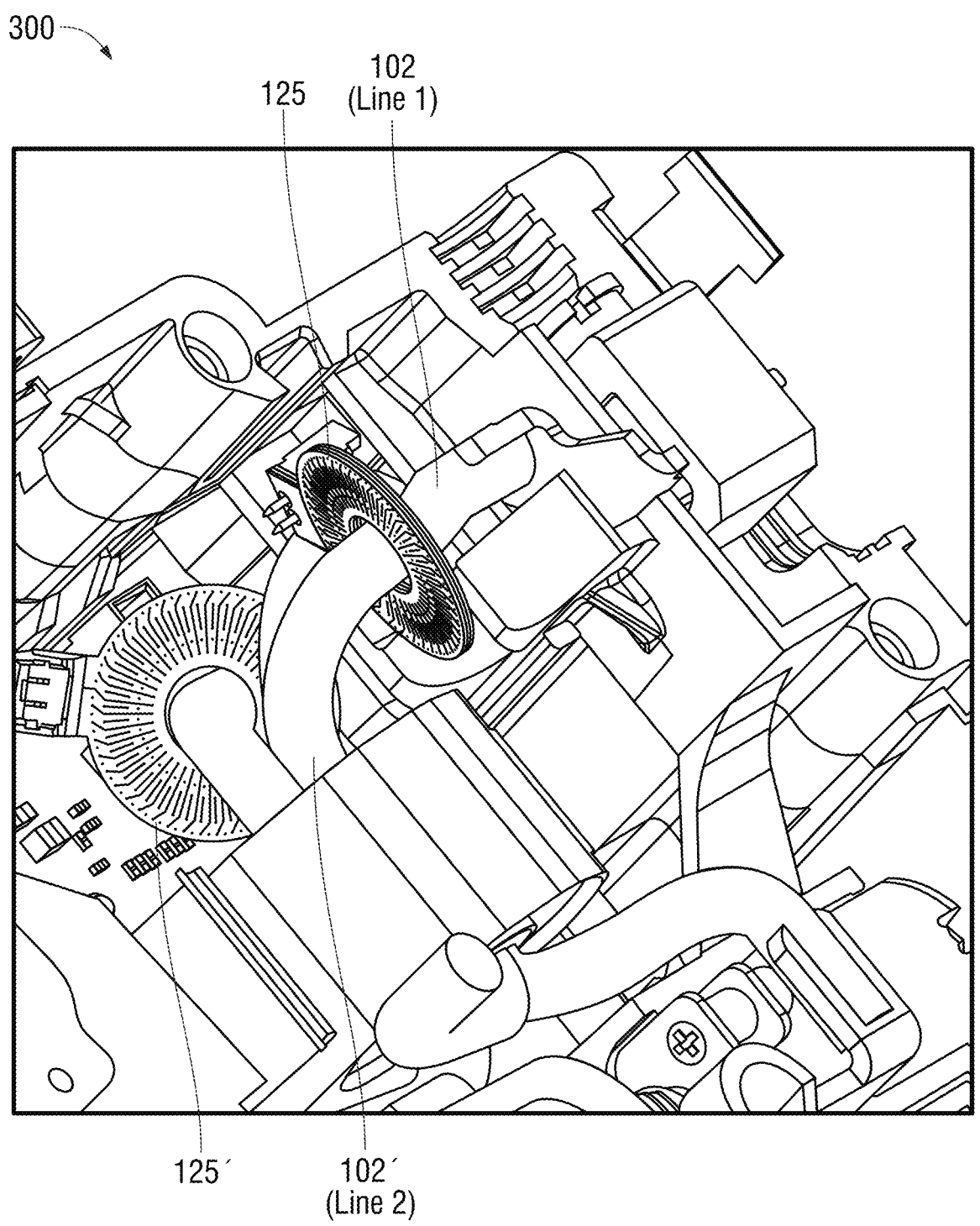
FIG. 3 shows a partial perspective view illustrating multiple PCB trace current sensors installed within a current flow monitoring device according to embodiments of the present disclosure.

FIG. 3 is a partial perspective view showing another breaker 300 having multiple PCB trace current sensors 125, 125' installed therein according to embodiments of the present disclosure. The breaker 300 in this example operates in a similar manner as the breaker 100 from FIG. 2, except that the breaker 300 has two poles and uses two PCB trace current sensors, one PCB trace current sensor 125 for sensing current in the main conductor 102 (Line 1), and a separate but similar PCB trace current sensor 125' for sensing current in a second conductor 102' (Line 2). The breaker 300 may then detect occurrence of a fault condition based on current sensed by the ground fault sensor 110, and monitor and measure energy and power usage using an energy measurement circuit like the energy measurement circuit 130. The energy measurement circuit calculates energy and power using current signals collected by the PCB trace current sensors 125 and 125' from Line 1 and Line 2, respectively, and voltages from Line 1 and Line 2, respectively.

Persons having ordinary skill in the art will appreciate that additional PCB trace current sensors similar to the PCB trace current sensor 125 may also be used, depending on the particular application. In breaker 100, for instance, the main conductor 102 and/or the neutral conductor 108 are sensed by a single PCB trace current sensor 125. Nevertheless, two or more of such PCB trace current sensors may be utilized to monitor current in several conductors (e.g., Line 1, Line 2, Line 3, Neutral, etc.).

Figure 4:
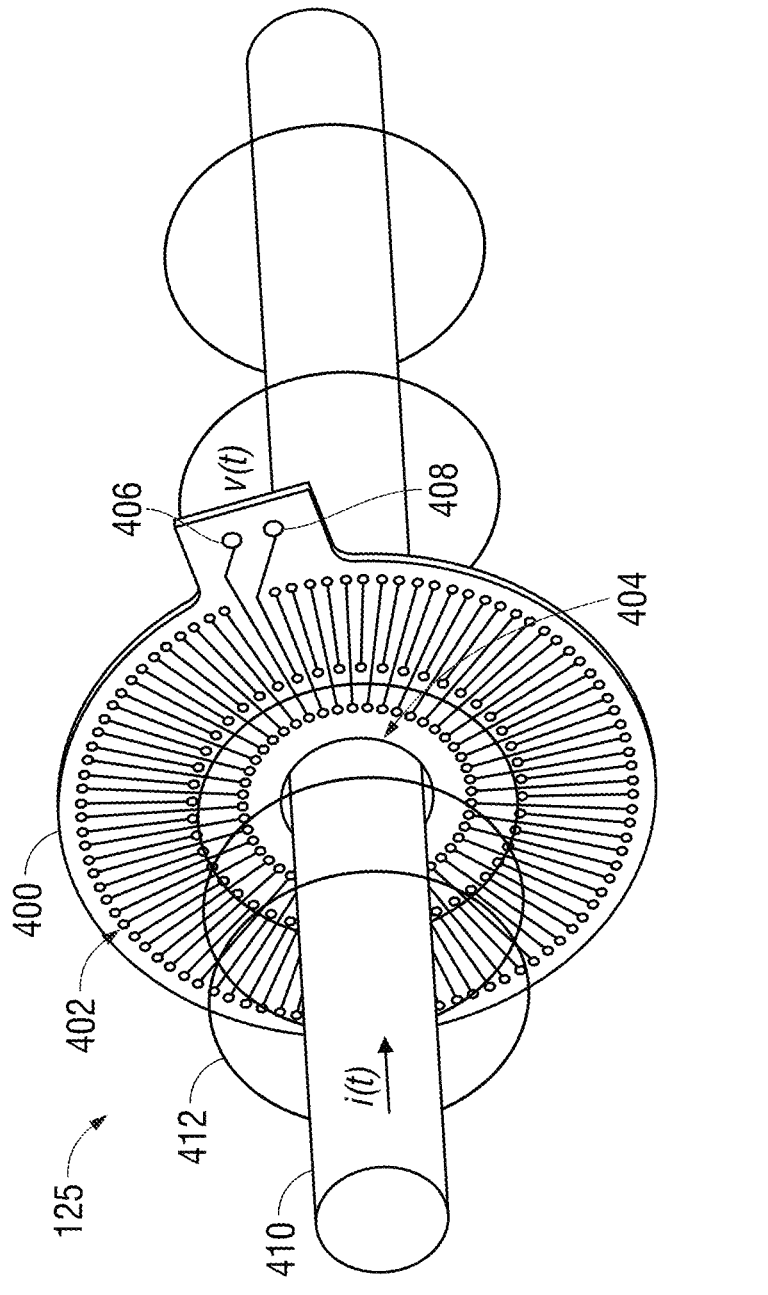
FIG. 4 shows a conceptual diagram illustrating operation of an exemplary PCB trace current sensor according to embodiments of the present disclosure.

FIG. 4 is a conceptual diagram showing the PCB trace current sensor 125 in operation according to embodiments of the present disclosure. As this figure illustrates, the PCB trace current sensor 125 is composed of a generally circular contour PCB substrate 400 having a plurality of elongate conductive traces 402 formed therein and extending generally radially outward from a central opening or hole 404 in the PCB substrate 400. Note that although the PCB substrate 400 is shown as having a circular contour, embodiments of the present disclosure also encompass non-circular contour shapes, such as polygonal shapes (e.g., rectangular, triangular, etc.). As will be explained later herein, the elongate conductive traces 402 are connected to one another by vias to form a conductive helix encircling the central opening 404 in the PCB substrate 400 that electrically resembles a Rogowski coil. Lead terminals 406, 408 for the Rogowski coil may then be formed by omitting any given via and connecting circuit leads to the open-ended traces for the given via.

In general operation, as understood in the art, an alternating current i(t) flowing in a conductor 410 running through the opening 404 in the PCB trace current sensor 125 induces an alternating electromagnetic field around the conductor 410, indicated by field lines 412. The alternating electromagnetic field 412 in turn induces an alternating voltage v(t) in the conductive traces 402 that is proportional to the current i(t) in the conductor 410. The alternating voltage v(t) can then be sampled and measured at the terminals 406, 408 to monitor the current flowing through the conductor 410.

Figure 5A:
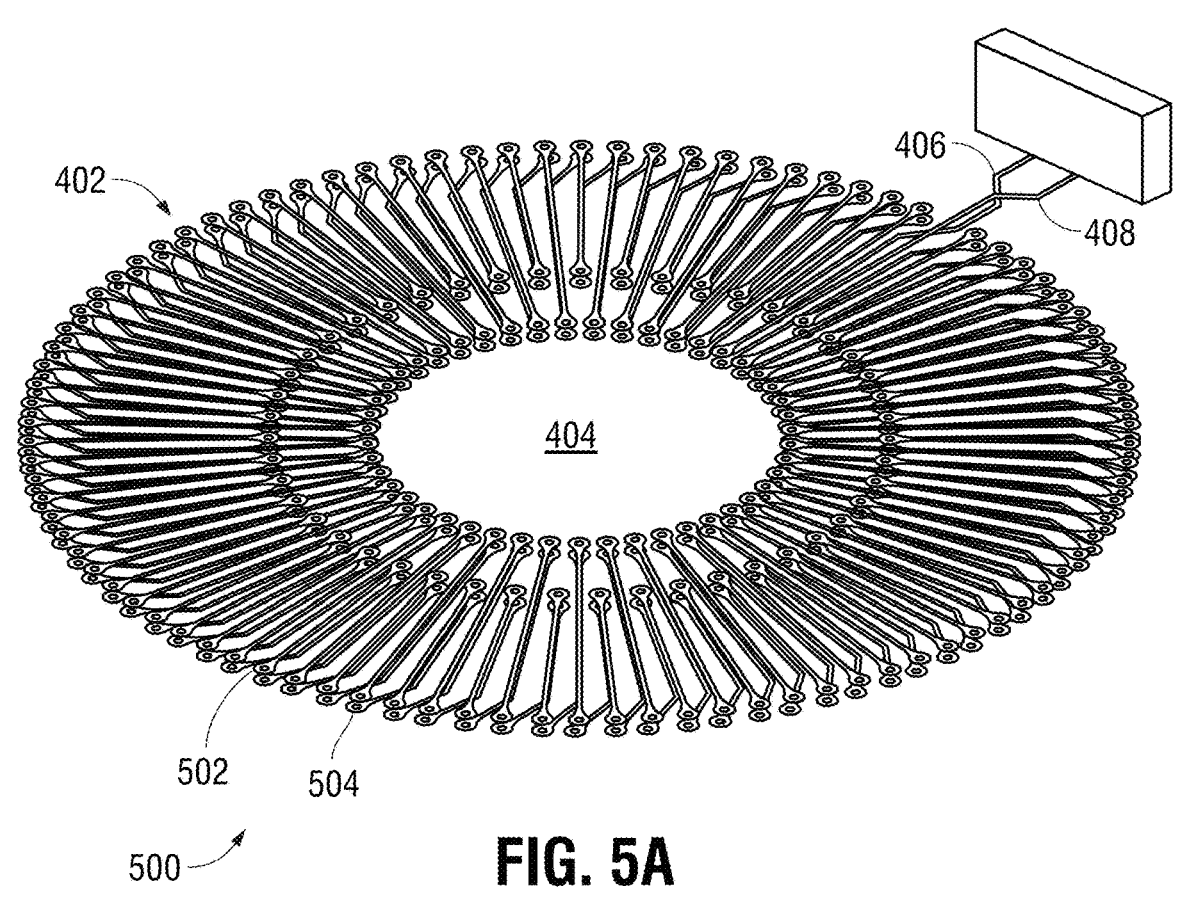
FIGS. 5A and 5B show perspective views illustrating exemplary conductive traces for a PCB trace current sensor according to embodiments of the present disclosure.
Figure 5B:
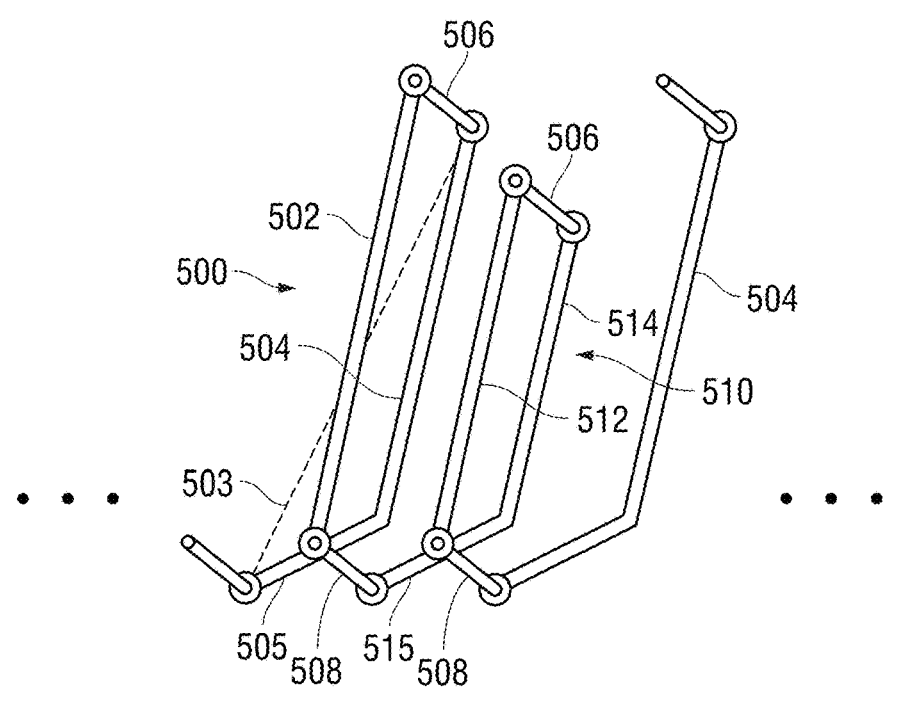

FIGS. 5A and 5B show perspective views illustrating the elongate conductive traces 402 of the PCB trace current sensor 125 in more detail according to embodiments of the present disclosure. In these views, the PCB substrate 400 from FIG. 4 has been omitted for better viewing of the plurality of elongate traces 402.

Referring first to FIG. 5A, in some embodiments, the plurality of traces 402 are arranged in pairs such that each pair forms one of the coil windings of the PCB trace current sensor 125. Multiple pairs of conductive traces may then be connected together by electrically conductive vias to form the coil windings for the PCB trace current sensor 125. An exemplary coil winding is generally indicated at 500 and includes a top side trace 502 and a bottom side trace 504 formed directly opposite one another on the PCB substrate (not shown here). The pair of traces 502, 504 extend radially outward from the central opening 404 in the PCB substrate to form the coil winding 500.

FIG. 5B shows a close-up view of the coil winding 500 and an adjacent coil winding 510 composed of a top side trace 512 and a bottom side trace 514. The pair of traces 512, 514 of the adjacent coil winding 510 are also formed directly opposite one another on the PCB substrate (not shown here) and also extend radially outward from the central opening 404 in the PCB substrate. To accommodate the radially outward direction, in some embodiments, the coil winding 500 and the adjacent coil winding 510 may have different overall lengths. For example, the coil winding 500 may have a longer overall length compared to the adjacent coil winding 510, or vice versa. This arrangement avoids overcrowding of the traces 402 on the PCB substrate near the central opening 404, thereby allowing a greater number of traces to be used for the PCB trace current sensor 125. It will be understood that trace overcrowding is not a prerequisite for using coil windings that have different overall lengths, and that different length coil windings may be used regardless of the number of coil windings in the PCB trace current sensor (i.e., even when there is no overcrowding of the traces).

As can be seen in FIG. 5B, each pair of traces 502, 504 and 512, 514 in the coil windings 500, 510 is connected to vias, one via at each end of each trace. For example, a via 506 at one end of the top trace 502 connects that trace to its bottom trace 504 in the coil winding 500, while another via 508 at the other end of the top trace 502 connects the trace to the bottom trace 514 in the adjacent coil winding 510. To facilitate the latter connection, the bottom or opposite trace in each pair of traces may run at an angle (or curves), as indicated by the dashed line 503, or have a portion or segment that angles (or curves), as indicated at 505 and 515, in the direction of the bottom or opposite trace in an adjacent coil winding. The above trace-to-trace connection pattern is repeated for each coil winding and adjacent in the plurality of traces 402 until the traces are connected to one another. The result is a conductive helix encircling the central opening 404 in the PCB substrate that behaves like a Rogowski coil electrically. Lead terminals 406, 408 for the PCB trace current sensor 125 may then be formed by omitting the via at one end of a given pair of traces and connecting circuit leads to the open-ended traces.

Figures 6A, 6B:
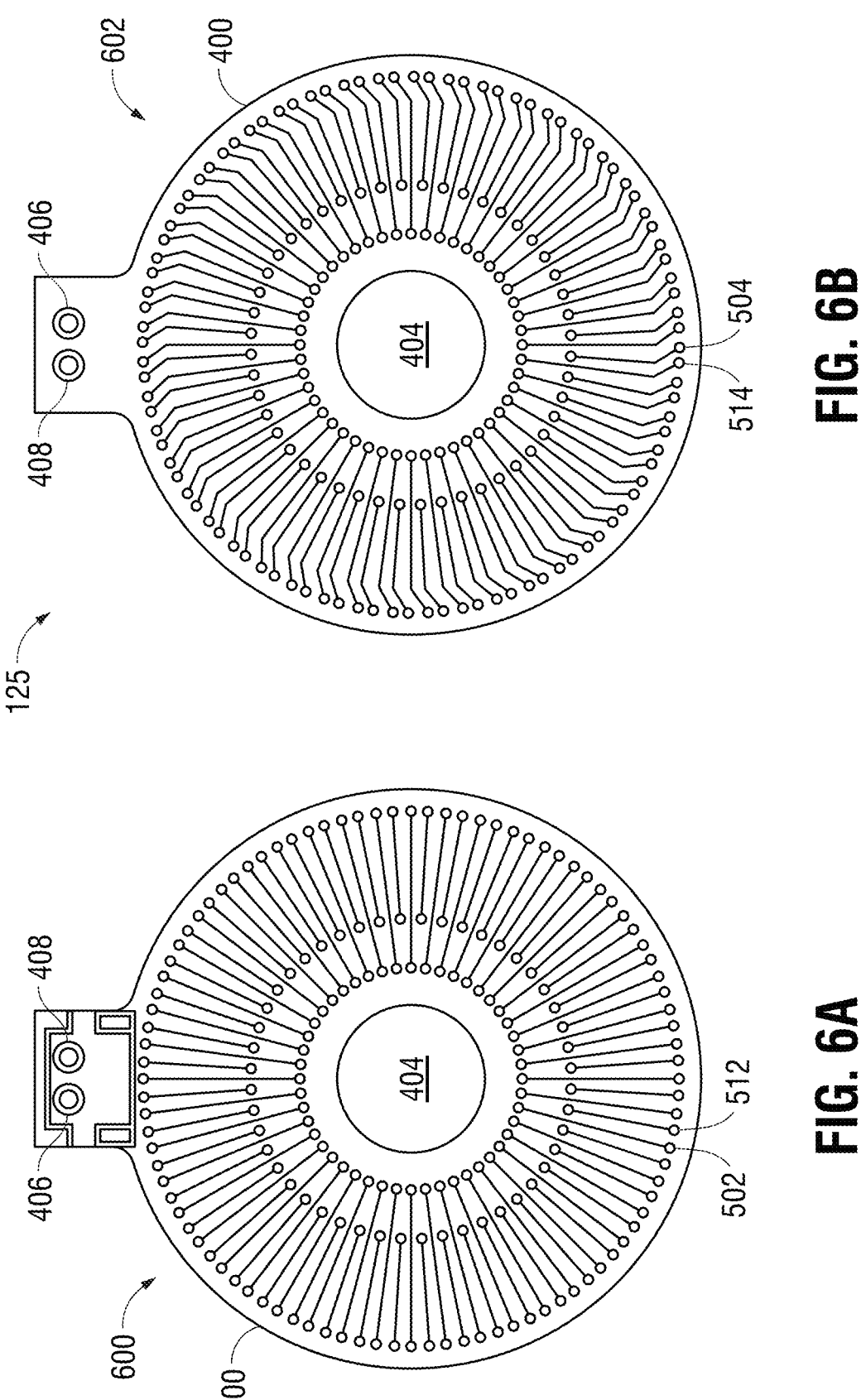
FIGS. 6A and 6B show top side and bottom side views of an exemplary PCB trace current sensor according to embodiments of the present disclosure.

FIGS. 6A and 6B show top side and bottom side views, respectively, of the PCB trace current sensor 125 according to embodiments of the present disclosure. As this figure shows, the PCB substrate 400 of the PCB trace current sensor 125 has a top side 600 and a bottom side 602. The top side 600 in this embodiment has top side traces that resemble the top side traces 502, 512 from FIGS. 5A and 5B in that the traces have no angled (or curved) segments like the angled segments 505, 515. In contrast, the bottom side 602 in this embodiment has bottom side traces that resemble the bottom side traces 504, 514 from FIGS. 5A and 5B in that they each have an angled (or curved) segment like the angle segments 505, 515. The lead terminals 406, 408 can also be seen in these views and may take any suitable form known to those skilled in the art.

Figure 7A:
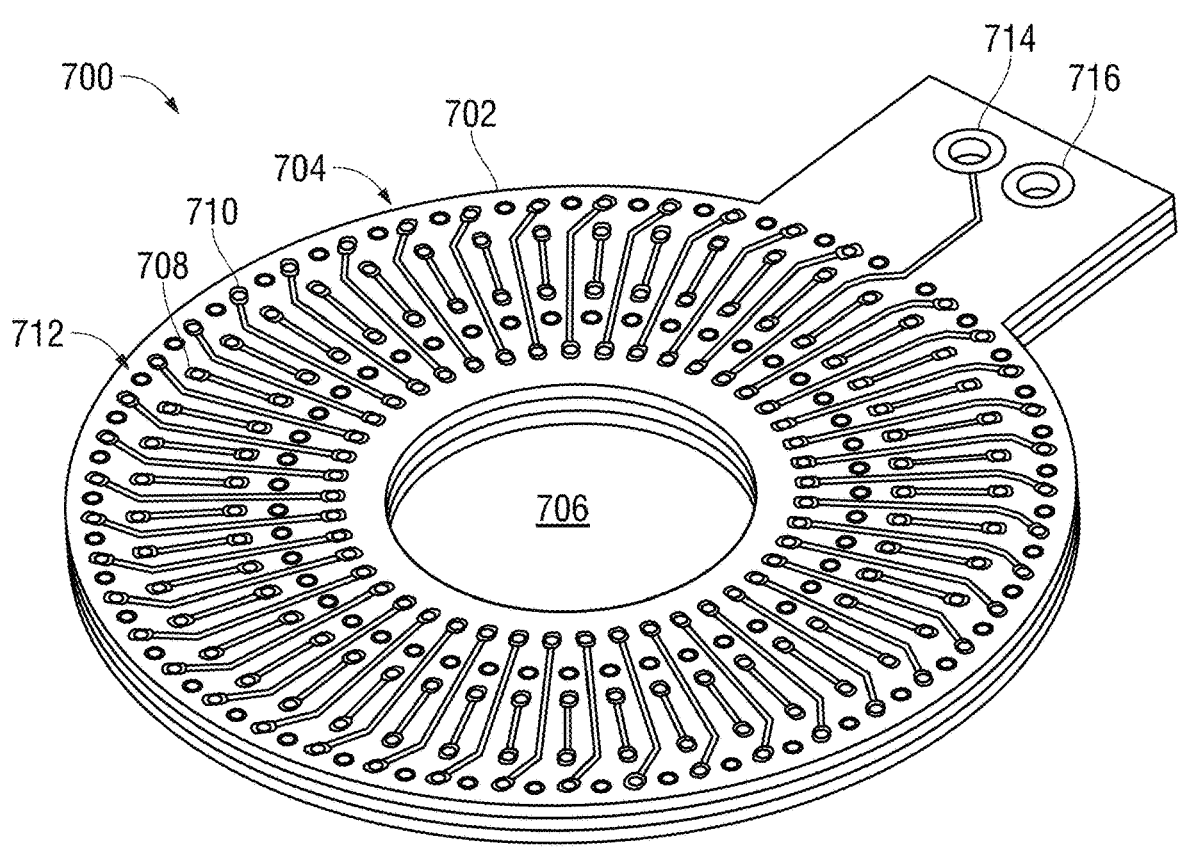
FIGS. 7A and 7B show perspective views of an exemplary PCB trace current sensor having a multi-layer coil according to embodiments of the present disclosure.
Figure 7B:
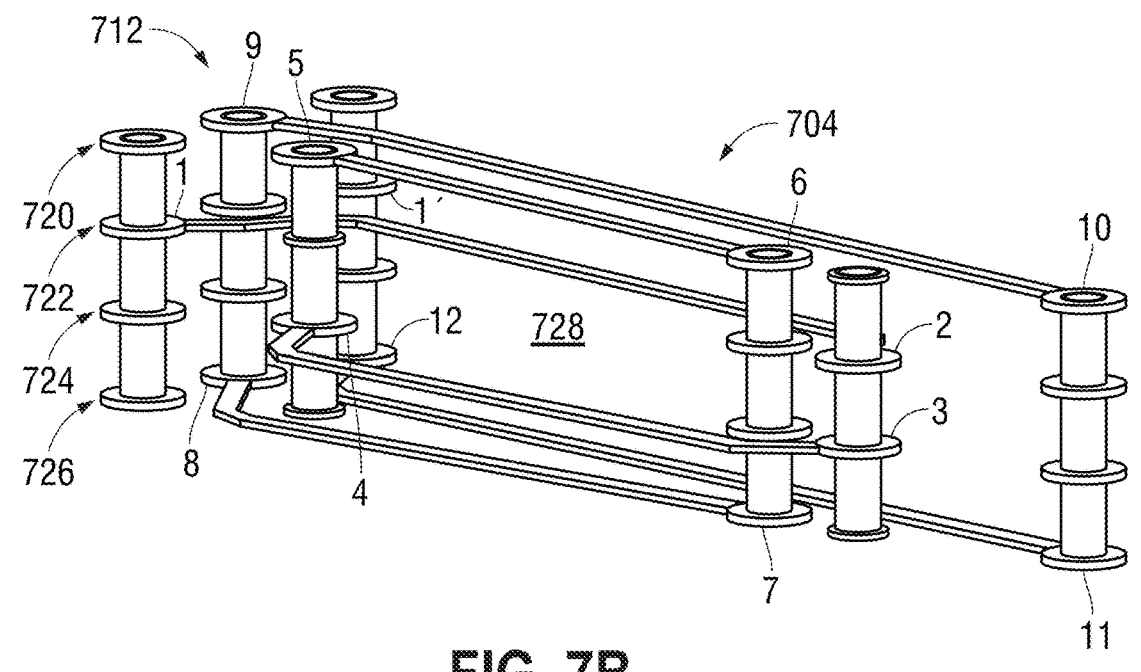

FIGS. 7A and 7B are perspective views showing another PCB trace current sensor 700 according to alternative embodiments of the present disclosure. In this example, the coil windings of the Rogowski coil are formed using multiple PCB substrate layers.

Referring first to FIG. 7A, the PCB trace current sensor 700 in this example is similar to the PCB trace current sensors discussed previously insofar as there is a generally circular PCB substrate 702 having a plurality of elongate conductive traces 704 formed on a top layer and extending generally radially outward from a central opening or hole 706 in the PCB substrate 702. Note that the circular shape of the PCB substrate 702 is exemplary only, and that non-circular shapes are also contemplated, such as polygonal shapes. The top layer of the PCB substrate 702 in this embodiment may have both traces 708 with no angled (or curved) segments and traces 710 with angled segments, arranged in an alternating fashion. Additionally, although not visible here, the PCB substrate 702 may also have one or more internal layers in addition to a bottom layer, each layer having conductive traces 704 formed thereon and arranged so as to form the coil windings of the PCB trace current sensor 700. A plurality of vias 712 may then be provided to connect the traces 704 together to form the coil windings for the PCB trace current sensor 700. Lead terminals 714, 716 for the PCB trace current sensor 700 may be formed by omitting a given via and connecting circuit leads to the open-ended traces for the given via.

FIG. 7B is a partial perspective view showing some of the conductive traces 704 and vias 712 arranged on the one or more internal layers mentioned above to form a multi-layer coil winding, with the PCB substrate 702 omitted for ease of viewing. As can be seen, there are four layers of conductive traces 704 in this example, a top layer 720, two internal layers 722 and 724, and a bottom layer 726. The conductive traces 704 on each layer 720, 722, 724, 726 may then be connected together by the vias 712, as shown, to form a multi-layer coil winding, indicated at 728, within the PCB trace current sensor 700.

In this example, the multi-layer coil winding 728 starts at point 1 located on internal layer 722, continues toward point 2 on the same layer, then proceeds by means of one of the vias 712 to point 3 on another internal layer 724, then to point 4 on the same internal layer. Points 1-4 form one turn of the coil winding 728. From point 4, the coil winding 728 proceeds to point 5 on the top layer 720 through another one of the vias 712 and continues to point 6 on the same layer. Another via 712 connects point 6 to point 7 on the bottom layer 726 where the coil winding 728 continues to point 8 on the same layer. Points 5-8 form another turn of the coil winding 728. From point 8, the coil winding 728 proceeds to point 9 on the top layer 720 through yet another one of the vias 712 and continues to point 10 on the same layer. Another via 712 connects point 10 to point 11 on the bottom layer 726 where the coil winding 728 continues to point 12 on the same layer. Points 9-12 form the final turn in the coil winding 728 in this example. Another multi-layer coil winding may begin at point 1' and continue in a similar manner as described above.

Figure 8:
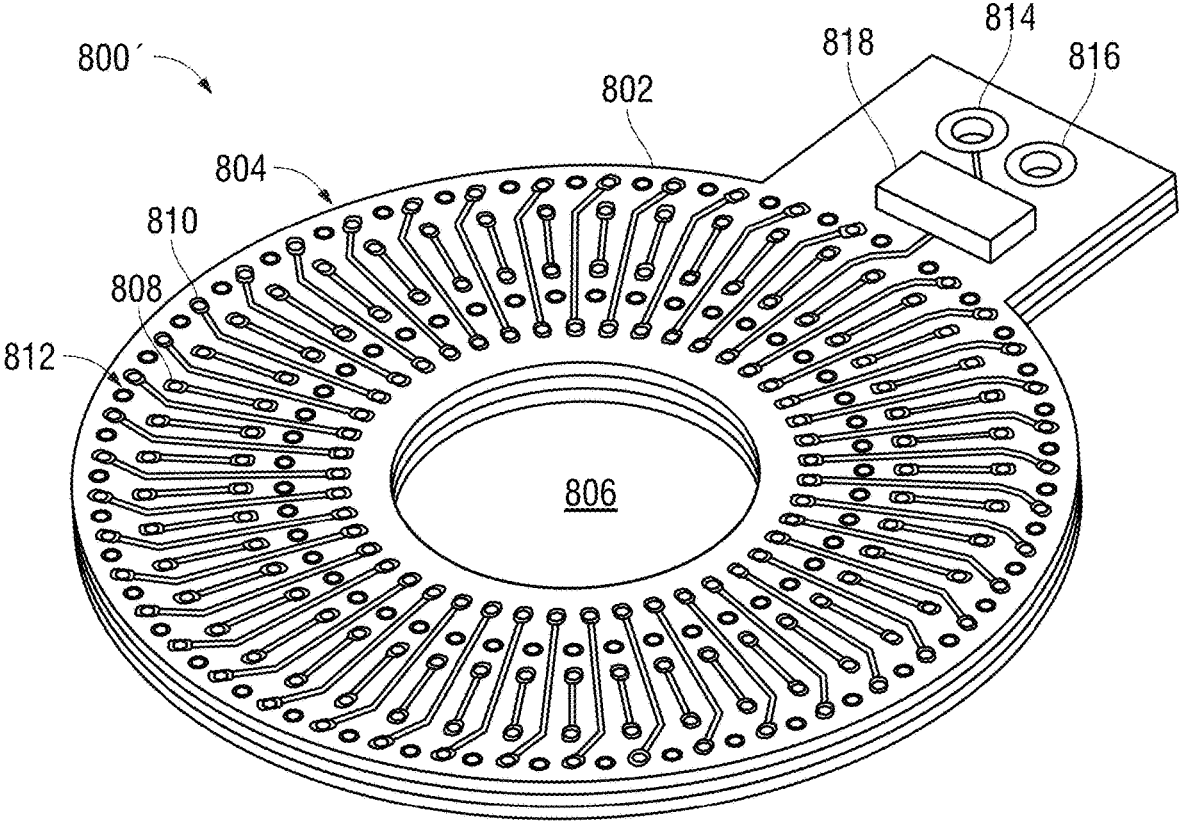
FIG. 8 shows a perspective view illustrating a PCB trace current sensor with onboard signal conditioning according to embodiments of the present disclosure.

FIG. 8 is a perspective view showing an alternative PCB trace current sensor 800 according to embodiments of the present disclosure. The PCB trace current sensor 800 shown here is otherwise similar to the PCB trace current sensor 700 from FIG. 7 insofar as there is a generally circular PCB substrate 802 having a plurality of elongate conductive traces 804 formed on a top layer and extending generally radially outward from a central opening or hole 806 in the PCB substrate 802. Note again that the circular shape of the PCB substrate 802 is exemplary only, and that non-circular shapes are also contemplated, such as polygonal shapes. The top layer of the PCB substrate 802 in this embodiment may likewise have both traces 808 with no angled (or curved) segments and traces 810 with angled segments, arranged in an alternating fashion. Additionally, although not visible here, the PCB substrate 802 may also have one or more internal layers in addition to a bottom layer, each layer having a conductive trace 804 formed thereon and arranged so as to form the coil windings of the PCB trace current sensor 800. A plurality of vias 812 may then be provided to connect the traces 804 together to form the coil windings for the PCB trace current sensor 800. Lead terminals 814, 816 for the PCB trace current sensor 800 may be formed by omitting a given via and connecting circuit leads to the open-ended traces for the given via. In addition, a signal conditioning circuit 818 is provided on the PCB substrate 802 for convenient signal conditioning and processing. The voltages produced by the PCB trace current sensor 800 may then be conditioned prior to being provided as an output signal by the lead terminals 814, 816.

Thus far, PCB trace current sensors have been shown and described wherein the PCB substrates have a generally circular contour. Those skilled in the art will appreciate that PCB substrates having non-circular contours may also be used within the scope of the present disclosure, such as polygonal shapes (e.g., triangular, rectangular, etc.).

Figure 9:
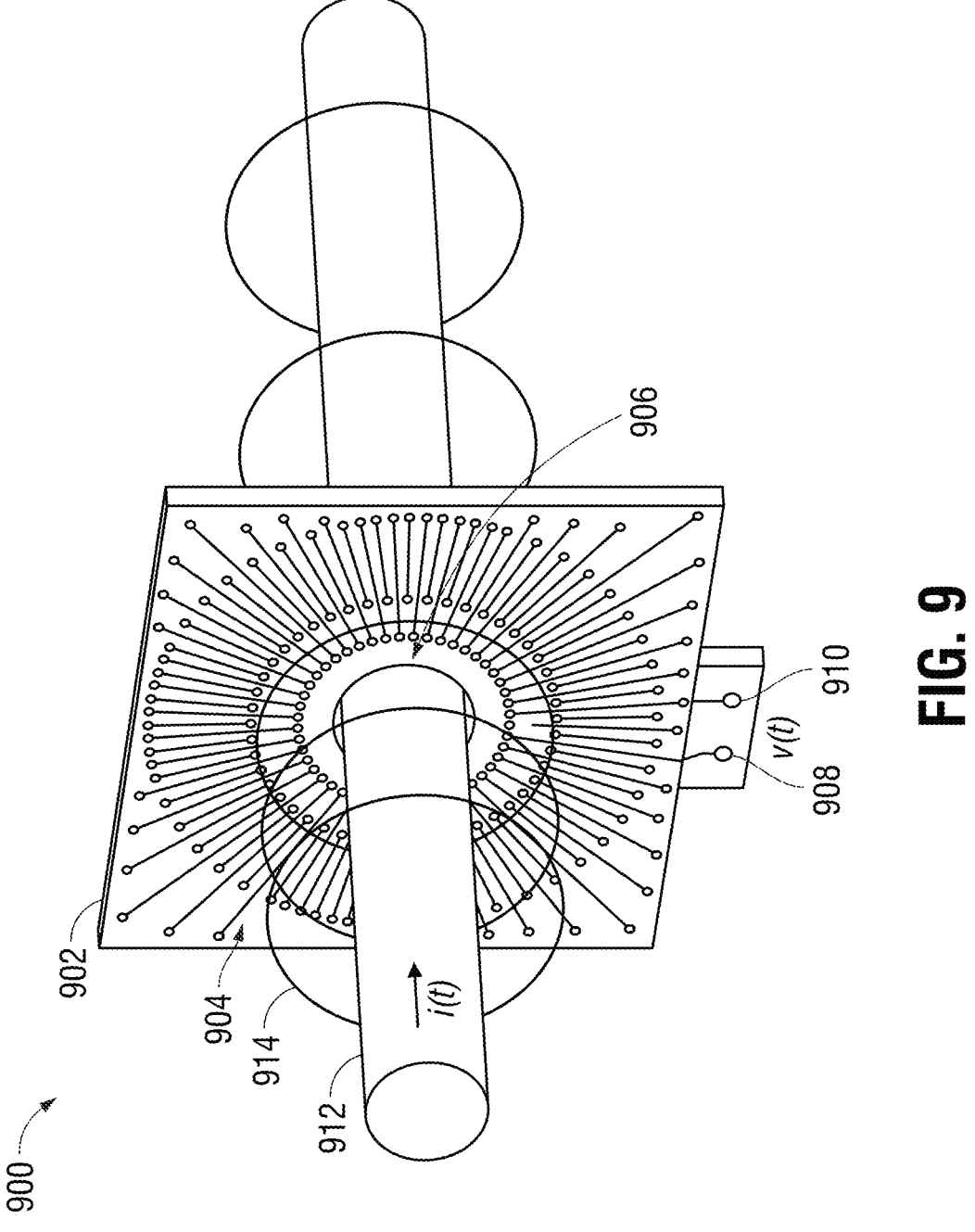
FIG. 9 shows a conceptual diagram illustrating operation of another exemplary PCB trace current sensor according to embodiments of the present disclosure.

FIG. 9 is a conceptual diagram showing another PCB trace current sensor 900 in operation, this one having a generally rectangular contour according to some embodiments. As can be seen, the PCB trace current sensor 900 is otherwise similar to its circular counterpart in FIG. 4 except for a PCB substrate 902 having a square contour. Like its counterpart in FIG. 4, the PCB substrate 902 has a plurality of elongate conductive traces 904 formed therein and extending generally radially outward from a central opening or hole 906 in the PCB substrate 902. The elongate conductive traces 904 are again connected to one another by vias to form a conductive helix encircling the central opening 906 in the PCB substrate 902 that behaves like a Rogowski coil electrically. Lead terminals 908, 910 for the Rogowski coil may again be formed by omitting any given via and connecting circuit leads to the open-ended traces.

In general operation, as understood in the art, an alternating current i(t) flowing in a conductor 912 running through the opening 906 in the PCB trace current sensor 900 induces an alternating electromagnetic field around the conductor 912, indicated by field lines 914. The alternating electromagnetic field 914 in turn induces an alternating voltage v(t) in the conductive traces 904 that is proportional to the current i(t) in the conductor 912. The alternating voltage v(t) can then be sampled and measured at the terminals 908, 910 to monitor the current flowing through the conductor 912.

Figure 10:
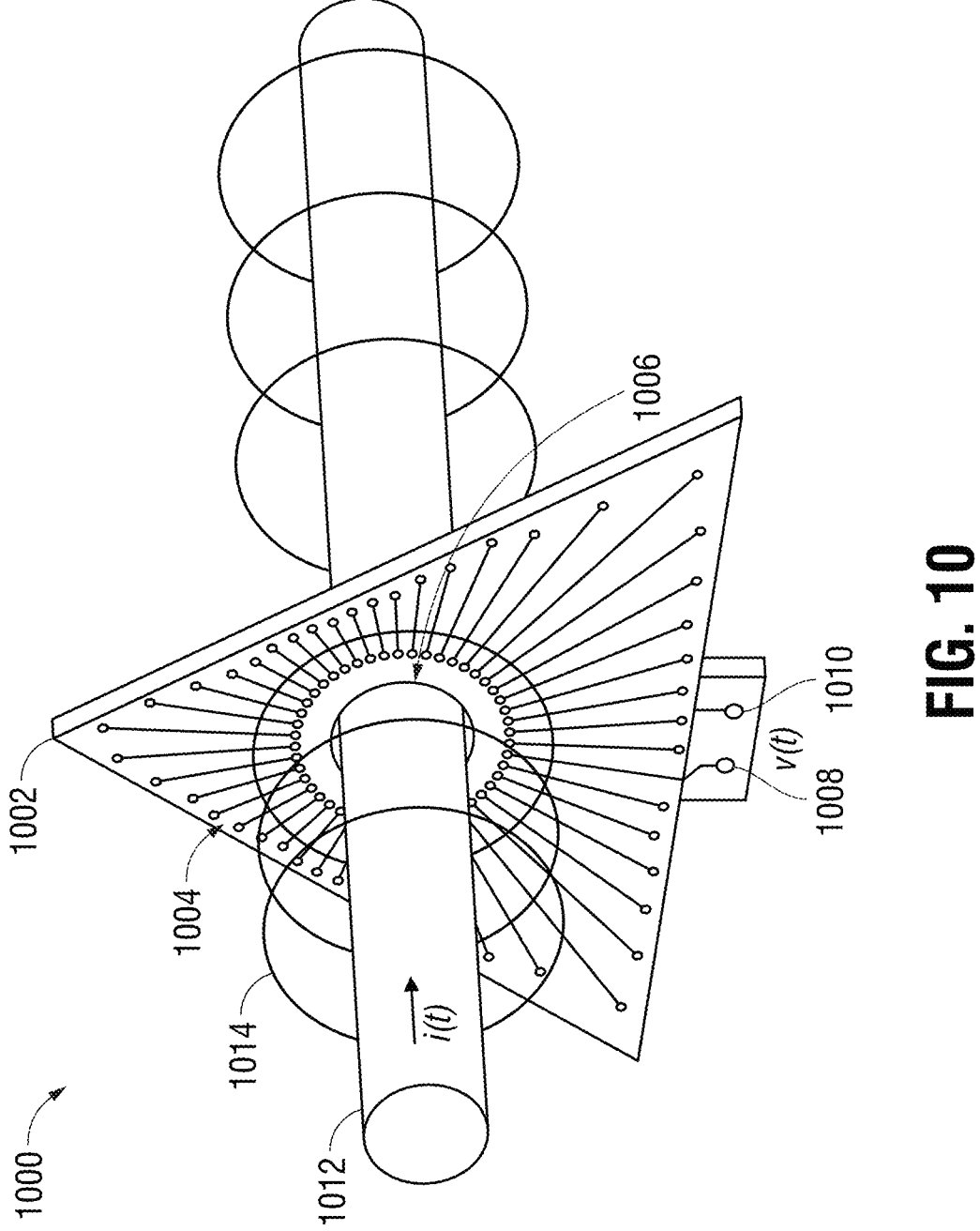
FIG. 10 shows a conceptual diagram illustrating operation of yet another exemplary PCB trace current sensor according to embodiments of the present disclosure.

FIG. 10 is a conceptual diagram showing yet another PCB trace current sensor 1000 in operation, this one having a generally triangular contour according to some embodiments. The PCB trace current sensor 1000 here is again similar to its circular counterpart in FIG. 4 except for a PCB substrate 1002 having a triangular contour. Like its counterpart in FIG. 4, the PCB substrate 1002 has a plurality of elongate conductive traces 1004 formed therein and extending generally radially outward from a central opening or hole 1006 in the PCB substrate 1002. The elongate conductive traces 1004 are once again connected to one another by vias to form a conductive helix encircling the central opening 1006 in the PCB substrate 1002 that electrically resembles a Rogowski coil. Lead terminals 1008, 1010 for the Rogowski coil may once again be formed by omitting any given via and connecting circuit leads to the open-ended traces for that via.

In general operation, an alternating current i(t) flowing in a conductor 1012 running through the opening 1006 in the PCB trace current sensor 1000 induces an alternating electromagnetic field around the conductor 1012, indicated by field lines 1014. The alternating electromagnetic field 1014 again induces an alternating voltage v(t) in the conductive traces 1004 that is proportional to the current i(t) in the conductor 1012. The alternating voltage v(t) can then be sampled and measured at the terminals 1008, 1010 to monitor the current flowing through the conductor 1012.

Figures 11A, 11B:
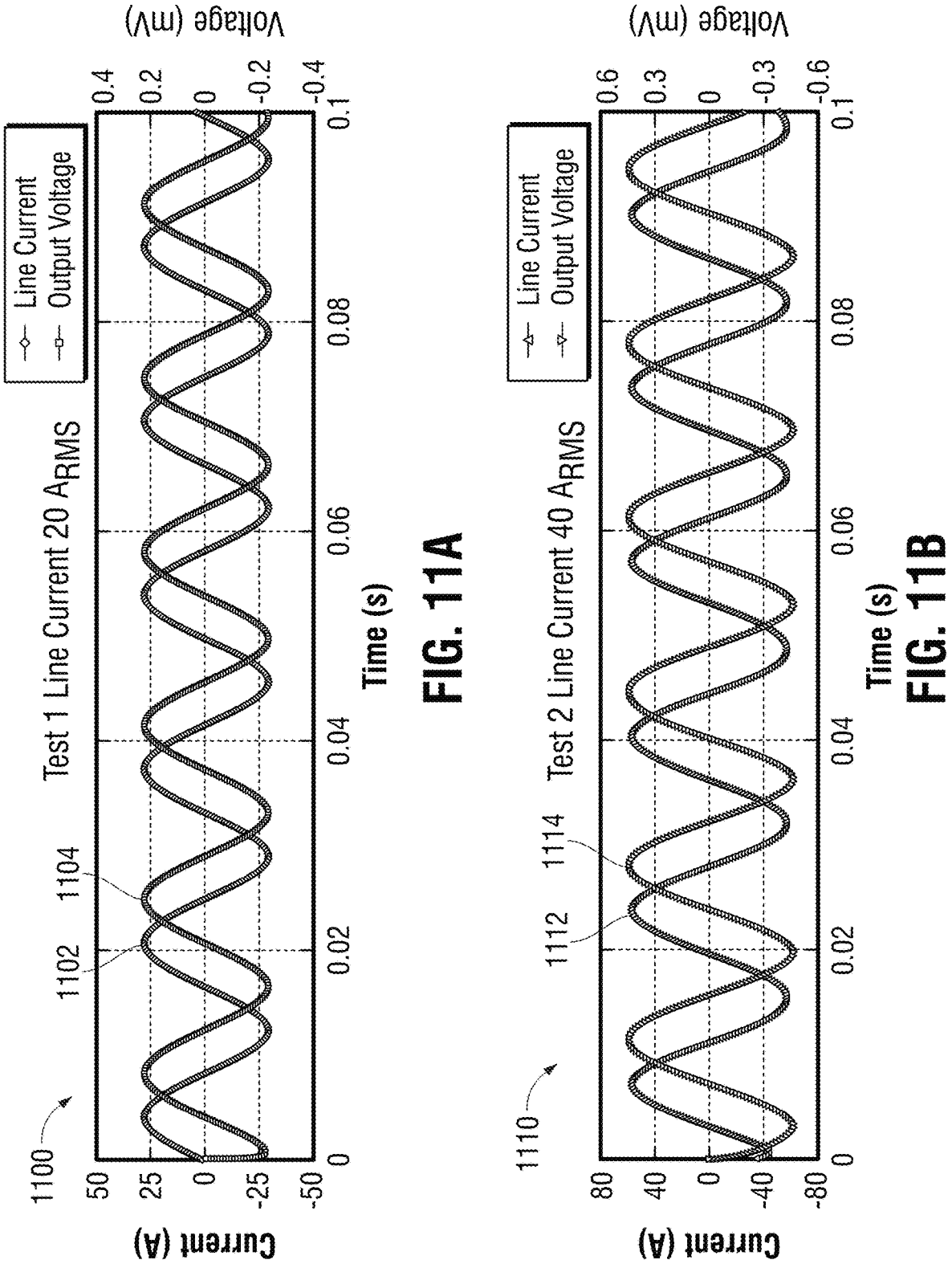
FIGS. 11A and 11B show graphs illustrating exemplary performance of a PCB trace current sensor according to embodiments of the present disclosure.

Referring now to FIGS. 11A and 11B, graphs 1100 and 1110 are shown illustrating performance under test conditions for a PCB trace current sensor according to embodiments of the present disclosure. In both graphs 1100, 1110, the left vertical axis represents test current, the right vertical axis represents current sensor voltage, and the horizontal axis represents time. The first graph 1100, shown in FIG. 11A, illustrates the results of testing using a line current of 20 Amps RMS. Current waveform 1102 represents the line current and voltage waveform 1104 represents the voltage signal produce by the PCB trace current sensor (and conditioned by a signal processing front end) in response to the line current. As can be seen, the voltage waveform 1104 closely tracks the current waveform 1102, indicating that the PCB trace current sensor was able to accurately sense the line current. The second graph 1110, shown in FIG. 11B, illustrates the results of testing using a line current of 40 Amps RMS. Current waveform 1112 represents the line current and voltage waveform 1114 represents the voltage signal produce by the PCB trace current sensor in response to the line current. Again, it can be seen that the voltage waveform 1114 closely tracks the current waveform 1112, indicating that the PCB trace current sensor was able to accurately sense the line current.

FIG. 12 illustrates a flowchart depicting a method 1200 that may be used with a PCB trace current sensor in accordance with embodiments of the present disclosure. The flowchart shows several functional blocks, each block representing a step or function that may be performed in the method 1200. It should be noted that although discrete blocks are shown, those having ordinary skill in the art will appreciate that a given block may be divided into two or more constituent blocks, or two or more of the blocks shown may be combined into a single block, without departing from the scope of the present disclosure. In addition, although the blocks are shown in a particular sequence, those having ordinary skill in the art will understand that a different sequence may be followed without departing from the scope of the present disclosure.

The method 1200 generally begins at block 1202 where a printed circuit board (PCB) substrate is provided. The PCB substrate may have a circular contour, or it may have a non-circular contour, such as a rectangular or triangular contour, depending on the particular implementation. At block 1204, electrically conductive traces are formed on the PCB substrate extending radially outward from a central opening of the PCB substrate. The traces may be arranged in pairs to form a coil winding, with one trace in a pair being formed on the opposite side of the PCB substrate from the other trace. In some embodiments, one or more additional electrically conductive traces may also be formed on one or more internal layers of the PCB substrate to form the coil winding.

At block 1206, the traces are electrically connected to one another by means of vias in the PCB substrate to form coil windings that resemble an electrically conductive helix encircling the central opening in the PCB substrate, frequently referred to as a Rogowski coil. This entails arranging the traces so that the vias connect each coil winding to an adjacent coil winding in some embodiments. At block 1208, lead terminals are created on the PCB substrate for, example, by omitting a given via for a given coil winding. The lead terminals are electrically connected to the electrically conductive traces to allow the PCB trace current sensor, in turn, to be connected to components in the current monitoring device.

At block 1210, the PCB substrate with the PCB trace current sensor thereon is connected to a device that monitors current flow and/or energy usage, with the PCB substrate positioned to receive a current conductor of the device through the current sensor. Examples of suitable devices include protection devices (e.g., circuit breakers), metering devices, wiring devices, and similar devices. In some embodiments, multiple such PCB substrates may be mounted in the current flow monitoring device, for example, one PCB substrate for each pole in a multi-pole circuit breaker.

Once the PCB substrate is connected, then at block 1212, the PCB trace current sensor is used to sense current in the current flow monitoring device in the manner described above. That is, an alternating current flowing in the current conductor induces an alternating electromagnetic field around the conductor, which in turn induces an alternating voltage in the PCB trace current sensor that is proportional to the current in the conductor. The alternating voltage may then be sampled and used to determine the amount of current flowing in the conductor. At block 1214, appropriate action is taken by the current flow monitoring based on the current measured in the device, such as actuating a trip mechanism in the case of a circuit breaker, or calculating energy usage in the case of a metering device, and the like.

While several embodiments of the present disclosure have been shown and described herein, it is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein, but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

We claim:

1. A current sensor, comprising:

a printed circuit board (PCB) substrate having a central opening therein;

a plurality of electrically conductive elongate traces on the PCB substrate extending radially outward from the central opening;

a plurality of vertical interconnect access (vias) on the PCB substrate, the vias connecting the traces together so as to form a conductive helix encircling the central opening in the PCB substrate that electrically resembles a Rogowski coil; and lead terminals on the PCB substrate, the lead terminals electrically connected to the plurality of electrically conductive elongate traces;

wherein the lead terminals are formed by omitting a given via and terminating the traces for the given via.

2. The current sensor according to claim 1, further comprising a signal conditioning circuit mounted on the PCB substrate, the signal conditioning circuit configured to provide signal conditioning and processing for any voltage signal outputted by the current sensor.

3. The current sensor according to claim 1, further comprising at least one elongate conductive trace formed on at least one internal layer of the PCB substrate, the at least one trace forming part of the conductive helix encircling the central opening in the PCB substrate.

4. The current sensor according to claim 1, wherein at least one of the traces on the PCB substrate includes an angled or curved segment.

5. The current sensor according to claim 1, wherein the conductive helix is composed of a plurality of coil windings on the PCB substrate and adjacent coil windings have different overall lengths.

6. A current sensor according to claim 1, wherein adjacent elongate traces on the PCB substrate have different lengths from one another and alternating elongate traces on the PCB substrate have the same length as one another.

7. A current sensor according to claim 1, wherein elongate traces directly opposite one another on different layers of the PCB substrate have substantially the same length as one another.

8. A current flow monitoring device, comprising:

a current conductor in the current flow monitoring device;

a neutral conductor in the current flow monitoring device;

a PCB trace current sensor mounted in the current flow monitoring device and configured to receive the current conductor therein; and a monitoring circuit operable to monitor the PCB trace current sensor and determine an amount of current flowing through the current conductor;

wherein the PCB trace current sensor comprises:

a printed circuit board (PCB) substrate having a central opening therein;

a plurality of electrically conductive elongate traces on the PCB substrate extending radially outward from the central opening;

a plurality of vertical interconnect access (vias) on the PCB substrate, the vias connecting the traces together so as to form a conductive helix encircling the central opening in the PCB substrate that electrically resembles a Rogowski coil; and wherein lead terminals are formed by omitting a given via and terminating the traces for the given via.

9. The current flow monitoring device according to claim 8, further comprising a signal conditioning circuit mounted on the PCB substrate, the signal conditioning circuit configured to provide signal conditioning and processing for any voltage signal outputted by the current sensor.

10. The current flow monitoring device according to claim 8, wherein at least one of the traces on the PCB substrate includes an angled or curved segment.

11. The current flow monitoring device according to claim 8, wherein the conductive helix is composed of a plurality of coil windings on the PCB substrate and adjacent coil windings have different overall lengths.

12. The current flow monitoring device according to claim 8, wherein the monitoring circuit comprises an energy measurement circuit configured to perform energy and power usage calculations using line voltage, neutral voltage, and current signals.

13. The current flow monitoring device according to claim 8, wherein the current flow monitoring device is one of: an advanced function miniature circuit breaker, a ground fault interrupt (GFI) receptacle wiring device, a GFI smart plug, or a metering device.

14. A method of providing a current sensor for use in a current flow monitoring device, the method comprising:

forming a plurality of electrically conductive elongate traces on a PCB substrate, the traces extending radially outward from a central opening of the PCB substrate;

providing a plurality of vertical interconnect access (vias) on the PCB substrate, the vias connecting the traces together so as to form a conductive helix encircling the central opening in the PCB substrate that electrically resembles a Rogowski coil; and creating lead terminals on the PCB substrate, the lead terminals electrically connected to the plurality of electrically conductive elongate traces;

wherein the lead terminals are formed by omitting a given via and terminating the traces for the given via.

15. The method according to claim 14, further comprising connecting the lead terminals on the PCB substrate to a current flow monitoring device, the PCB substrate receiving therethrough a current conductor in the current flow monitoring device.

16. The method according to claim 15, wherein connecting the lead terminals on the PCB substrate to the current flow monitoring device comprises connecting the lead terminals to an energy measurement circuit in the current flow monitoring device configured to perform energy and power usage calculations.

17. The method according to claim 14, further comprising providing a signal conditioning circuit on the PCB substrate, the signal conditioning circuit configured to provide signal conditioning and processing for any voltage signal outputted by the plurality of electrically conductive elongate traces.

18. The method according to claim 14, further comprising forming at least one elongate conductive trace on at least one internal layer of the PCB substrate, the at least one trace forming part of the conductive helix encircling the central opening in the PCB substrate.

19. The method according to claim 14, wherein the current flow monitoring device is one of: an advanced function miniature circuit breaker, a ground fault interrupt (GFI) receptacle wiring device, a GFI smart plug, or a metering device.

* * * * *